United States Patent
Mitarashi (10) Patent No.: US 6,982,597 B2
(45) Date of Patent: Jan. 3, 2006

(54) DIFFERENTIAL INPUT CIRCUIT

(75) Inventor: Mutsumi Mitarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 81 days.

(21) Appl. No.: 10/660,771

(22) Filed: Sep. 12, 2003

(65) Prior Publication Data
US 2004/0183597 A1 Sep. 23, 2004

(30) Foreign Application Priority Data
Mar. 19, 2003 (JP) .................................... 2003-076205

(51) Int. Cl.
*H03F 3/45* (2006.01)

(52) U.S. Cl. ....................................... 330/253; 330/261
(58) Field of Classification Search ................ 330/253, 330/254, 255, 257, 258, 261
See application file for complete search history.

(56) References Cited

U.S. PATENT DOCUMENTS 4,797,631 A    1/1989  Hsu et al.
6,639,431 B1 *  10/2003  Potter .......................... 327/65
6,657,485 B2 *  12/2003  Kimura ...................... 327/563
6,798,292 B1 *  9/2004  Viswanathan ................ 330/257

* cited by examiner

*Primary Examiner*—Henry Choe
(74) *Attorney, Agent, or Firm*—Nixon Peabody LLP; Donald R. Studebaker (57) ABSTRACT

A differential input circuit comprising only low withstand voltage transistors, which reliability is not affected even if a high power supply voltage is used. The first and second clamp circuits input the differential input signals IN+ and IN− which vibrate between the ground potential and the power supply potential VDD, and output the signals INH+ and INH− of which the lower limit potential is the bias potential BIAS2, and the signals INL+ and INL− of which the upper limit potential is the bias potential BIAS3. Using these signals, the folded cascode amplification circuit generates the differential output signals OUT+ and OUT− which vibrate between the ground potential and the power supply potential VCC (VCC<VDD). The bias circuit generates the bias potential of the transistor inside the folded cascode amplification circuit. The gate potential of the transistor in the folded cascode amplification circuit is set such that the voltages between the gate and the source and between the gate and the drain are smaller than VCC.

19 Claims, 10 Drawing Sheets

| INPUT | OUTPUT |
|---|---|
| IN+ > BIAS2 | INH+ ≃ IN+ |
| IN+ ≦ BIAS2 | INH+ ≃ BIAS2 |
| IN+ < BIAS3 | INL+ ≃ IN+ |
| IN+ ≧ BIAS3 | INL+ ≃ BIAS3 |

FIG. 10B

| INPUT | OUTPUT |
|---|---|
| IN+ > BIAS2 | INH+ ≃ IN+ |
| IN+ ≦ BIAS2 | INH+ ≃ BIAS2 |
| IN+ < BIAS3 | INL+ ≃ IN+ |
| IN+ ≧ BIAS3 | INL+ ≃ BIAS3 |

DIFFERENTIAL INPUT CIRCUIT

BACKGROUND OF THE INVENTION

1. Field of the Invention

The present invention relates to a differential input circuit using a folded cascode amplifier. The differential input circuit according to the present invention is used for a USB (Universal Serial Bus) interface, for example.

2. Description of Related Art

As the miniaturization of MOS transistors advances, the withstand voltage of gate oxide film is dropping. Therefore a power supply with lower voltage is used for an integrated circuit as the degree of integration becomes higher. Generally about 3.3 volts of power supply voltage is used for integrated circuits fabricated in about a 0.35 μm micro process. For integrated circuit fabricated in about a 0.18 μm micro process, about 1.8 volts of power supply voltage is used. In the case of 3.3 volt power supply voltage, the signal level of this integrated circuit vibrates between 0 volts and 3.3 volts. Similarly in the case of a 1.8 volt power supply voltage, the signal level of this integrated circuit vibrates between 0 volts and 1.8 volts. Therefore for interconnecting integrated circuits which have a different degree of integration, an interface circuit for converting the signal level is required.

Normally an interface circuit for converting the maximum potential of a signal from high potential into low potential uses a voltage which matches with the high potential as the power supply voltage. For example, an interface circuit which converts the maximum signal potential from 3.3 volts to 1.8 volts must use a 3.3 volt power supply. Therefore in such an interface circuit, a transistor of which the withstand voltage of the gate oxide film is 3.3 volts must be used.

Conventionally, a circuit using a folded cascode amplification circuit has been known as a differential amplification circuit. As a folded cascode amplification circuit, a circuit disclosed in FIG. 1 of U.S. Pat. No. 4,797,631, for example, is known. According to this folded cascode amplification circuit, a differential amplification circuit with which the distortion of waveforms is small and high frequency operation is implemented can be provided.

As described above, according to prior art, low withstand voltage transistors must be used to increase the degree of integration of an integrated circuit chip, and in order to connect this integrated circuit chip to a chip for which a high voltage power supply is used, a differential input circuit must be constructed with high withstand voltage transistors. In other words, conventionally even when an integrated circuit chip with a high degree of integration is fabricated, the differential input circuit alone must be constructed with high withstand voltage transistors. Therefore in an integrated circuit which has this type of differential input circuit, there were two types of film thickness for gate oxide film, which made the manufacturing process complicated. So to simplify the manufacturing process, a differential input circuit which is comprised of only low withstand voltage transistors and can operate with high power supply voltage is required.

In the folded cascode amplifier disclosed in the above patent document, operating a low withstand voltage transistor with high power supply voltage is not considered. If a voltage higher than the recommended voltage range is applied to a gate oxide film, it is possible that the age deterioration of a transistor is accelerated and the reliability of the integrated circuit drops.

SUMMARY OF THE INVENTION

It is an object of the present invention to provide a differential input circuit, which is comprised of only low withstand voltage transistors, of which reliability is not affected even if a high power supply voltage is used.

A differential input circuit according to the present invention comprises: a first clamp circuit for inputting one of differential input signals which vibrate between a first power supply potential supplied by a first power supply line and a second power supply potential (first power supply potential<second power supply potential) supplied by a second power supply line to generate a first control signal which depends on the higher potential of one of the differential input signals and a first reference potential, and to generate a second control signal which depends on the lower potential of one of the differential input signals and a second reference potential; a second clamp circuit for inputting the other of the differential input signals to generate a third control signal which depends on the higher potential of the other of the differential input signals and the first reference potential, and to generate a fourth control signal which depends on the lower potential of the other of the abovementioned differential input signals and the abovementioned second reference potential; a first output transistor for inputting a third power supply potential (first power supply potential<third power supply potential<second power supply potential), which is supplied by a third power supply line, from a control terminal and outputting one of the differential output signals from the first main electrode; a second output transistor for inputting the abovementioned third power supply potential from the control terminal and outputting the other of the differential output signals from the first main electrode; a first input circuit further comprising a first input transistor which inputs the second control signal from the control terminal, where the first main electrode is connected to the first power supply line via the first constant current source, and a second input transistor which inputs the fourth control signal from the control terminal, where the first main electrode is connected to the first power supply line via the first constant current source; a second input circuit further comprising a third input transistor which inputs the first control signal from the control terminal, where the first main electrode is connected to the second power supply line via the second constant source, and a fourth input transistor which inputs the third control signal from the control terminal and of which the first main electrode is connected to the second power supply line via the second constant current source; a folded cascode amplification circuit further comprising a third constant current source for supplying the current received from the second power supply line to the second main electrodes of the first output transistor and the second input transistor, a fourth constant current source for supplying the current received from the second power supply line to the second main electrodes of the second output transistor and the first input transistor, a fifth constant current source for emitting the current received from the second main electrodes of the fourth input transistor and the first output transistor to the first power supply line, and a sixth constant current source for emitting the current received from the second main electrodes of the third input transistor and the second output transistor to the first power supply line; and a bias circuit for supplying a control potential, with which the voltage between the control electrode and the first main electrode and the voltage between the control electrode and the second main electrode becomes smaller than the potential difference between the first and third power supply potentials, to the transistors constituting the first to sixth constant current sources.

By using the first and second clamp circuits, the voltage between the control electrode and the first main electrode and the voltage between the control electrode and the second main electrodes of the first to fourth input transistors can be smaller than the potential difference between the first and third power supply potentials. In addition, by using the bias circuit, the voltage between the control electrode and the first main electrode and the voltage between the control electrode and the second main electrode of the transistors constituting the first to sixth constant current sources can be smaller than the potential difference between the first and third power supply potentials.

BRIEF DESCRIPTION OF THE DRAWINGS

Other objects and advantages of the present invention will be described with reference to the accompanying drawings.

DESCRIPTION OF THE PREFERRED EMBODIMENTS

Embodiments of the present invention will now be described with reference to the accompanying drawings. In the drawings, the size, shape and positional relationship of each composing element is roughly shown sufficient to understand the present invention, and the numerical conditions to be described below are merely examples.

First Embodiment

The differential input circuit according to the first embodiment of the present invention will now be described with reference to FIG. 1 to FIG. 4.

Figure 1:
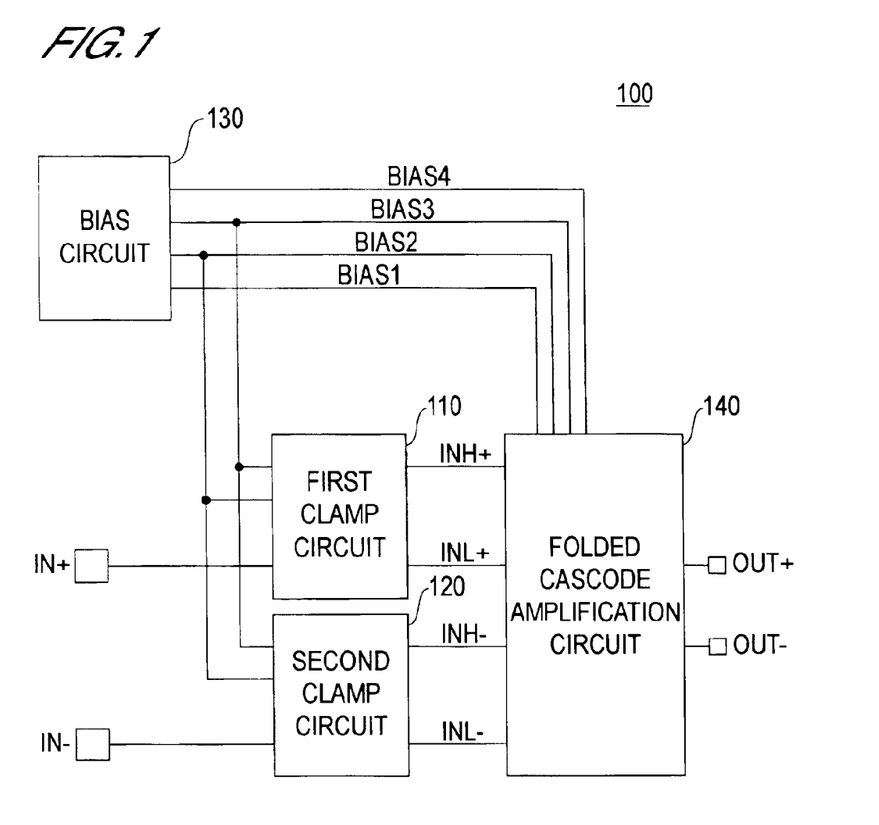
FIG. 1 is a block diagram depicting the general configuration of the differential input circuit according to the first embodiment.

FIG. 1 is a block diagram depicting the general configuration of the differential input circuit according to the present embodiment.

As FIG. 1 shows, the differential input circuit 100 comprises a first clamp circuit 110, second clamp circuit 120, bias circuit 130 and folded cascode amplification circuit 140.

Figure 10A:
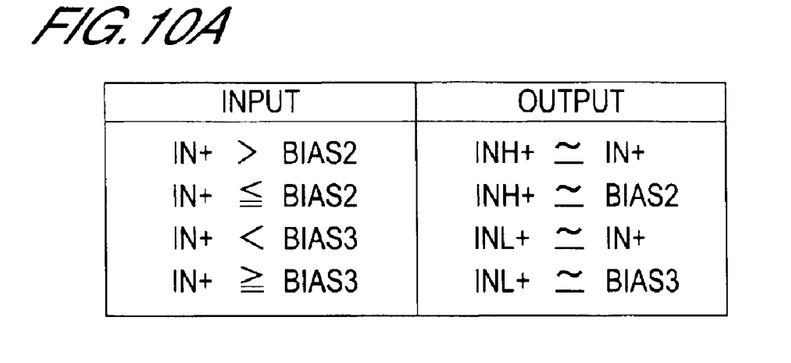
FIG. 10A is a table showing the operation logic of the first clamp circuit.

The first clamp circuit 110 inputs the signal IN+ from the outside, and inputs the bias potential BIAS2 (first reference potential of the present invention) and bias potential BIAS3 (second reference potential of the present invention) from the bias circuit 130. The signal IN+ vibrates between ground level (e.g. zero volts) and high voltage VDD (e.g. 3.3 volts). FIG. 10A shows the relationship between the input signal and the output signal in the clamp circuit 110. The clamp circuit 110 outputs voltage, which roughly matches the higher one of the voltage IN+ and BIAS2 as the output signal INH+. The clamp circuit 110 also outputs voltage, which roughly matches the lower one of IN+ and BIAS3 as the output signal INL+. The signals INH+ and INL+ are sent to the folded cascode amplification circuit 140.

Figure 10B:
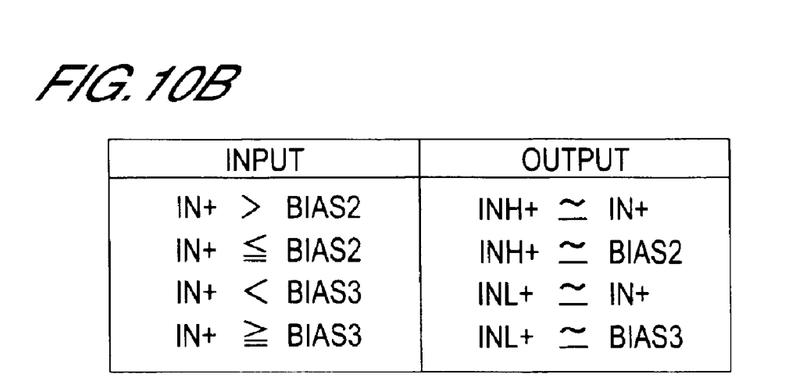
FIG. 10B is a table showing the operation logic of the second clamp circuit.

The second clamp circuit 120 inputs the signal IN− from the outside, and inputs the bias potentials BIAS2 and BIAS3 from the bias circuit 130. The signal IN− vibrates between the ground level and the high voltage VDD. FIG. 10B shows the relationship between the input signal and the output signal in the clamp circuit 120. The clamp circuit 120 outputs the voltage, which is roughly the same as the higher one of IN− and BIAS2, as the output signal INH−. Furthermore the clamp circuit 120 outputs the voltage, which is roughly the same as the lower one of IN− and BIAS3, as the output signal INL−. The signals INH− and INL− are sent to the folded cascode amplification circuit 140.

The bias circuit 130 generates the bias potentials BIAS1, BIAS2, BIAS3 and BIAS4 (0<BIAS1<BIAS2<BIAS3<BIAS4<VDD) using the high voltage power supply VDD. The bias potentials BIAS1, BIAS2, BIAS3 and BIAS4 are supplied to the folded cascode amplification circuit 140. In addition, the bias potentials BIAS2 and BIAS3 are also supplied to the clamp circuits 110 and 120.

The folded cascode amplification circuit 140 inputs the signals INH+ and INL+ from the clamp circuit 110, inputs the signals INH− and INL− from the clamp circuit 120, and inputs the bias potentials BIAS1, BIAS2, BIAS3 and BIAS4 from the bias circuit 130. As described later, the folded cascode amplification circuit 140 generates the differential output signals OUT+ and OUT− using the signals INH+, INL+, INH− and INL− and the bias potentials BIAS1, BIAS2, BIAS3 and BIAS4. The power supply differential output signals OUT+ and OUT− vibrate between the ground level and the low voltage VCC.

Now an example of the internal configuration of each circuit 110 through 140 will be described.

Figure 2A:
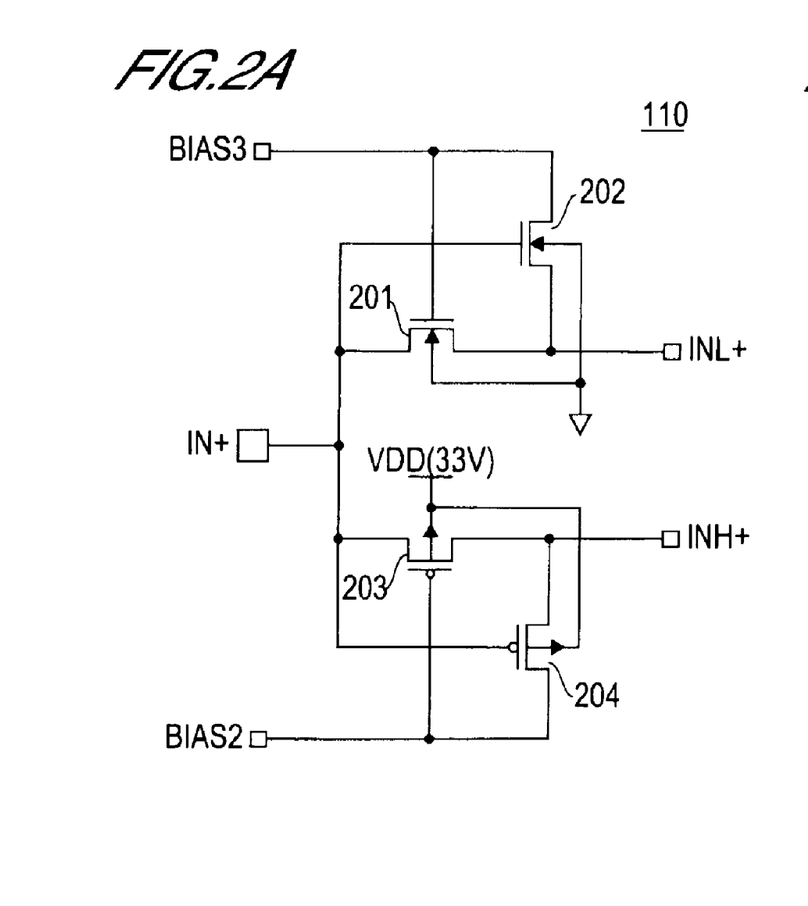
FIG. 2A is a diagram depicting the internal configuration of the first clamp circuit according to the first embodiment.

FIG. 2A is a circuit diagram depicting an example of the internal configuration of the first clamp circuit 110. As FIG. 2A shows, the clamp circuit 110 comprises nMOS transistors 201 and 202, and pMOS transistors 203 and 204. In the nMOS transistor 201, the drain is connected to the signal input terminal IN+, the source is connected to the signal output terminal INL+, and the gate is connected to the bias input terminal BIAS3. In the nMOS transistor 202, the drain is connected to the bias input terminal BIAS3, the source is connected to the signal output terminal INL+, and the gate is connected to the signal input terminal IN+. In the pMOS transistor 203, the source is connected to the signal input terminal IN+, the drain is connected to the signal output terminal INH+, and the gate is connected to the bias input terminal BIAS2. In the pMOS transistor 204, the source is connected to the bias input terminal BIAS2, the drain is connected to the signal output terminal INH+, and the gate is connected to the signal input terminal IN+. In the present embodiment, the differential input circuit 100 is constructed using a bulk CMOS structure. Therefore, as FIG. 2A shows, the substrates of the nMOS transistors 201 and 202 are connected to the ground line, and the substrates of the pMOS transistors 203 and 204 (n well regions) are connected to the high voltage power supply line VDD.

Figure 2B:
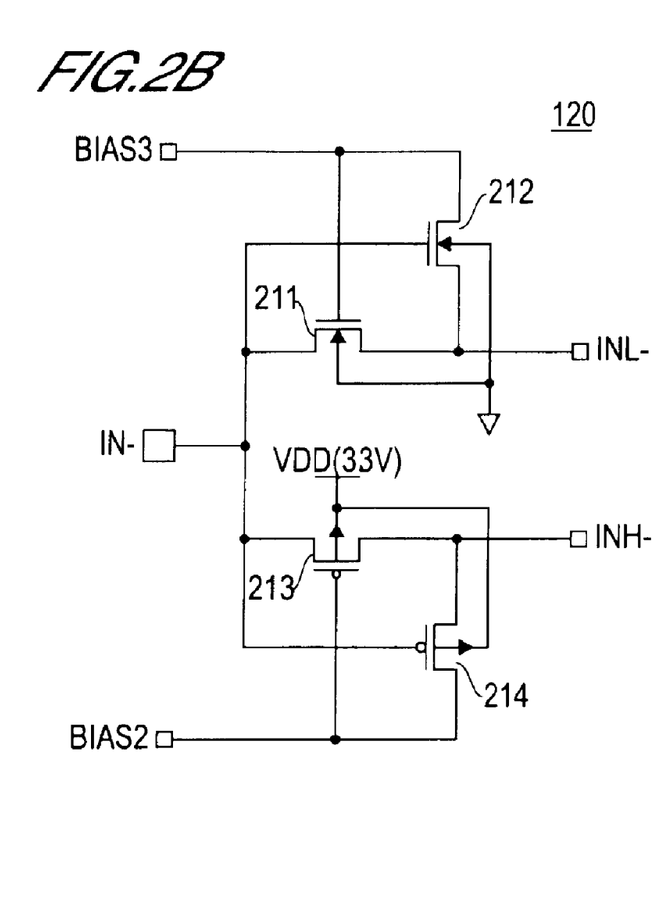
FIG. 2B is a diagram depicting the internal configuration of the second clamp circuit according to the first embodiment.

FIG. 2B is a circuit diagram depicting an example of the internal configuration of the second clamp circuit 120. As FIG. 2B shows, the configuration of the clamp circuit 120 is the same as the clamp circuit 110. The clamp circuit 120 comprises the nMOS transistors 211 and 212, and the pMOS transistors 213 and 214. In the nMOS transistor 211, the drain is connected to the signal input terminal IN−, the source is connected to the signal output terminal INL−, and the gate is connected to the bias input terminal BIAS3. In the nMOS transistor 212, the drain is connected to the bias input terminal BIAS3, the source is connected to the signal output terminal INL−, and the gate is connected to the signal input terminal IN−. In the pMOS transistor 213, the source is connected to the signal input terminal IN−, the drain is connected to the signal output terminal INH−, and the gate is connected to the bias input terminal BIAS2. In the pMOS transistor 214, the source is connected to the bias input terminal BIAS2, the drain is connected to the signal output terminal INH−, and the gate is connected to the signal input terminal IN−. As FIG. 2B shows, the substrates of the nMOS transistors 211 and 212 are connected to the ground line, and the substrates of the pMOS transistors 213 and 214 (n well regions) are connected to the high voltage power supply line VDD.

Figure 3:
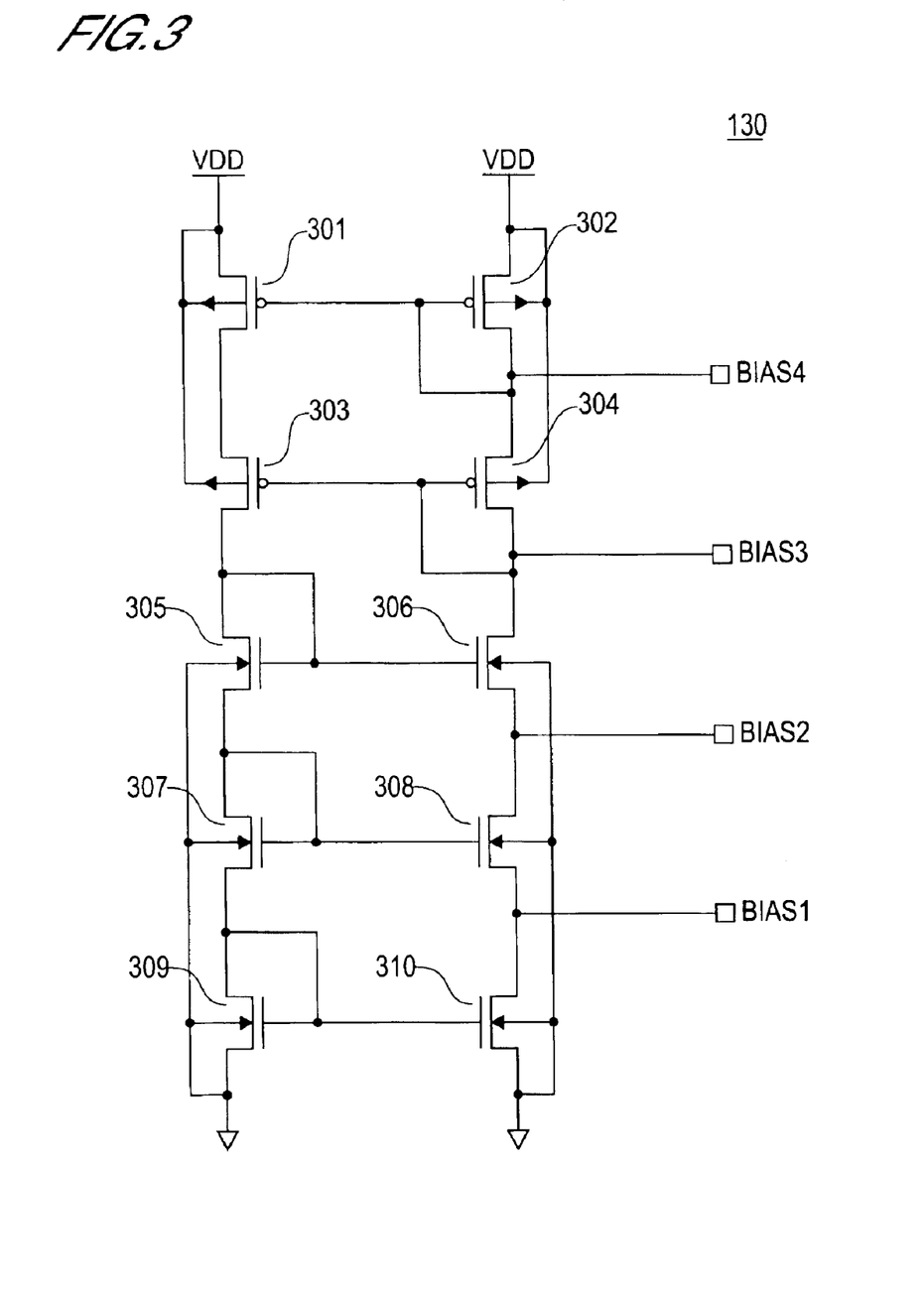
FIG. 3 is a diagram depicting the internal configuration of the bias circuit according to the first embodiment.

FIG. 3 is a circuit diagram depicting an example of the internal configuration of the bias circuit 130. As FIG. 3 shows, the bias circuit 130 comprises pMOS transistors 301 through 304, and nMOS transistors 305 through 310.

The pMOS transistors 301 and 302 constitute a current mirror circuit. In the pMOS transistor 301, the source is connected to the high voltage power supply line VDD (3.3 volts), and the gate is connected to the drain of the pMOS transistor 302. In the pMOS transistor 302, the source is connected to the high voltage power supply line VDD, and the gate and the drain are connected to the bias output terminal BIAS4.

The pMOS transistors 303 and 304 constitute a current mirror circuit. In the pMOS transistor 303, the source is connected to the drain of the pMOS transistor 301, and the gate is connected to the drain of the pMOS transistor 304. In the pMOS transistor 304, the source is connected to the drain of the pMOS transistor 302, and the gate and the drain are connected to the bias output terminal BIAS3.

The nMOS transistors 305 and 306 constitute a current mirror circuit. In the nMOS transistor 305, the drain and the gate are connected to the drain of the pMOS transistor 303. In the nMOS transistor 306, the drain is connected to the drain of the pMOS transistor 304, the source is connected to the bias output terminal BIAS2, and the gate is connected to the gate of the pMOS transistor 305.

The nMOS transistors 307 and 308 constitute a current mirror circuit. In the nMOS transistor 307, the drain and the gate are connected to the source of the nMOS transistor 305. In the nMOS transistor 308, the drain is connected to the source of the nMOS transistor 306, the source is connected to the bias output terminal BIAS1, and the gate is connected to the gate of the nMOS transistor 307.

The nMOS transistors 309 and 310 constitute a current mirror circuit. In the nMOS transistor 309, the drain and the gate are connected to the source of the nMOS transistor 307, and the source is connected to the ground line. In the nMOS transistor 310, the drain is connected to the source of the nMOS transistor 308, the source is connected to the ground line, and the gate is connected to the gate of the nMOS transistor 309.

In the present embodiment, the bias circuit 130 is constructed using a bulk CMOS structure. Therefore, as FIG. 3 shows, the substrates of the nMOS transistors 305 through 310 are connected to the ground line, and the substrates of the pMOS transistors 301 through 304 (n well regions) are connected to the high voltage power supply line VDD.

Figure 4:
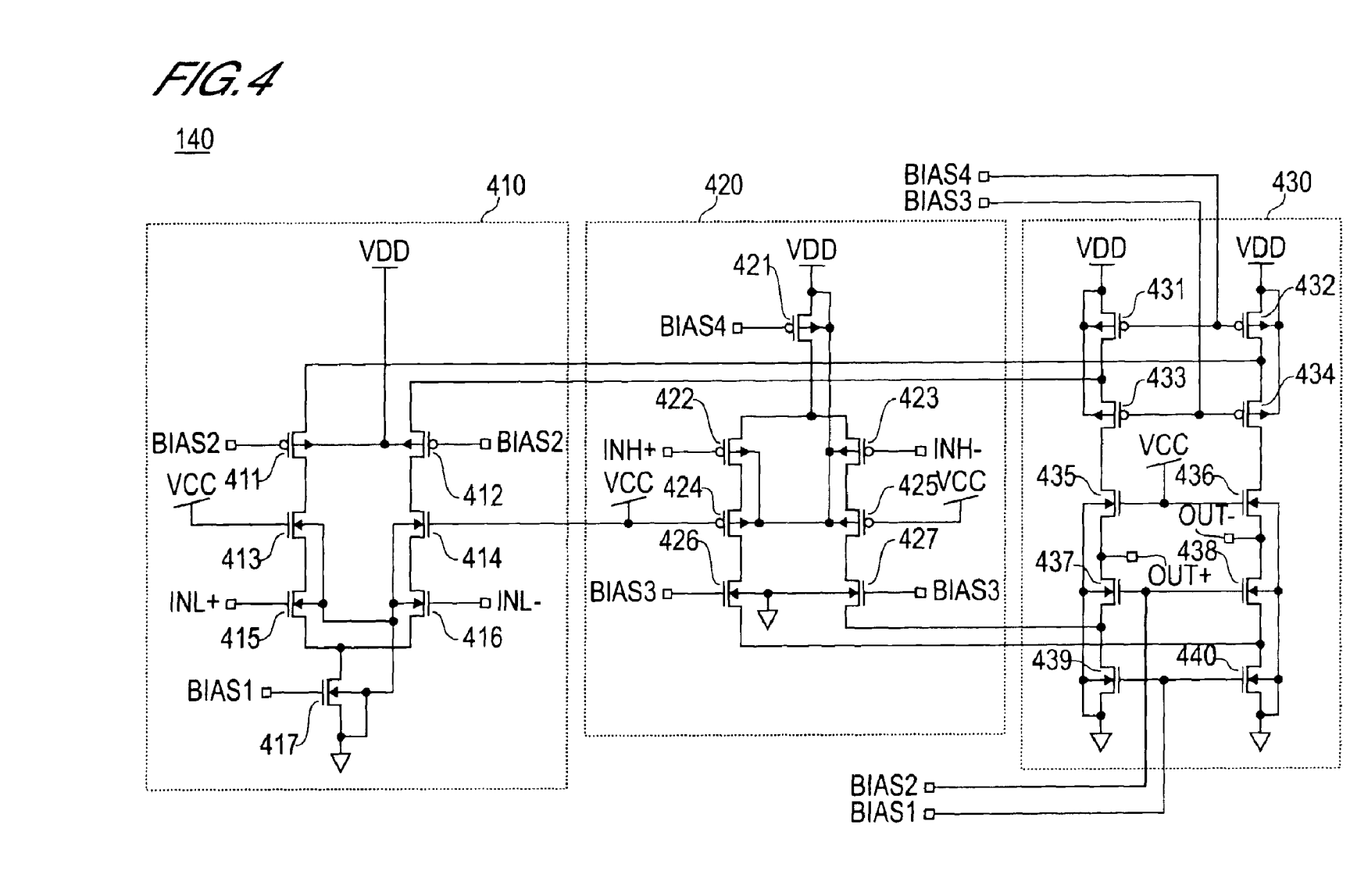
FIG. 4 is a diagram depicting the internal configuration of the folded cascode amplification circuit according to the first embodiment.

FIG. 4 is a circuit diagram depicting an example of the internal configuration of the folded cascode amplification circuit 140. As FIG. 4 shows, the folded cascode amplification circuit 140 comprises the first input circuit 410, the second input circuit 420, and the amplification circuit 430.

The first input circuit 410 is comprised of the pMOS transistors 411 and 412, and the nMOS transistors 413 through 417. Here the MOS transistors 411 and 413 correspond to the first protective transistors of the present invention, the MOS transistors 412 and 414 correspond to the second protective transistors of the present invention, the nMOS transistor 415 corresponds to the first input transistor of the present invention, the nMOS transistor 416 corresponds to the second input transistor of the present invention, and the nMOS transistor 417 corresponds to the first constant current source of the present invention. In the pMOS transistors 411 and 412, the gate is connected to the bias input terminal BIAS2. In the nMOS transistor 413, the drain is connected to the drain of the pMOS transistor 411, and the gate is connected to the low voltage power supply line VCC. In the nMOS transistor 414, the drain is connected to the drain of the pMOS transistor 412, and the gate is connected to the low voltage power supply line VCC. In the nMOS transistor 415, the drain is connected to the source of the nMOS transistor 413, and the gate is connected to the signal input terminal INL+. In the nMOS transistor 416, the drain is connected to the source of the nMOS transistor 414, and the gate is connected to the signal input terminal INL−. In the nMOS transistor 417, the drain is connected to the source of the nMOS transistors 415 and 416, the source is connected to the ground line, and the gate is connected to the bias input terminal BIAS1.

The second input circuit 420 is comprised of the pMOS transistors 421 through 425, and the nMOS transistors 426 and 427. Here the pMOS transistor 421 corresponds to the second constant current source of the present invention, the pMOS transistor 422 corresponds to the third input transistor of the present invention, the pMOS transistor 423 corresponds to the fourth input transistor of the present invention, the MOS transistors 424 and 426 correspond to the third protective transistors of the present invention, and the MOS transistors 425 and 427 correspond to the fourth protective transistors of the present invention. In the pMOS transistor 421, the source is connected to the high voltage power supply line VDD, and the gate is connected to the bias input terminal BIAS4. In the pMOS transistor 422, the source is connected to the drain of the pMOS transistor 421, and the gate is connected to the signal input terminal INH+. In the pMOS transistor 423, the source is connected to the drain of the pMOS transistor 421, and the gate is connected to the signal input terminal INH−. In the pMOS transistor 424, the source is connected to the drain of the pMOS transistor 422, and the gate is connected to the low voltage power supply line VCC. In the pMOS transistor 425, the source is connected to the drain of the pMOS transistor 423, and the gate is connected to the low voltage power supply line VCC. In the nMOS transistor 426, the drain is connected to the drain of the pMOS transistor 424, and the gate is connected to the bias input terminal BIAS3. In the nMOS transistor 427, the drain is connected to the drain of the pMOS transistor 425, and the gate is connected to the bias input terminal BIAS3.

The amplification circuit 430 is comprised of the pMOS transistors 431 through 434 and the nMOS transistors 435 through 440. Here the nMOS transistor 435 corresponds to the first output transistor of the present invention, the nMOS transistor 436 corresponds to the second output transistor of the present invention, the MOS transistors 431, 432, 439 and 440 corresponds to the third to sixth constant current sources respectively, and the MOS transistors 433, 437, 434 and 438 corresponds to the fifth to eighth protective transistors of the present invention respectively. In the pMOS transistor 431, the source is connected to the high voltage power supply line VDD, the drain is connected to the source of the pMOS transistor 412, and the gate is connected to the bias input terminal BIAS4. In the pMOS transistor 432, the source is connected to the high voltage power supply line VDD, the drain is connected to the source of the pMOS transistor 411, and the gate is connected to the bias input terminal BIAS4. In the pMOS transistor 433, the source is connected to the drain of the pMOS transistor 431, and the gate is connected to the bias input terminal BIAS3. In the pMOS transistor 434, the source is connected to the drain of the pMOS transistor 432, and the gate is connected to the bias input terminal BIAS3. In the nMOS transistor 435, the drain is connected to the drain of the pMOS transistor 433, the source is connected to the signal output terminal OUT+, and the gate is connected to the low voltage power supply line VCC. In the nMOS transistor 436, the drain is connected to the drain of the pMOS transistor 434, the source is connected to the signal output terminal OUT−, and the gate is connected to the low voltage power supply line VCC. In the nMOS transistor 437, the drain is connected to the source of the nMOS transistor 435, the source is connected to the source of the nMOS transistor 427, and the gate is connected to the bias input terminal BIAS2. In the nMOS transistor 438, the drain is connected to the source of the nMOS transistor 436, the source is connected to the source of the nMOS transistor 426, and the gate is connected to the bias input terminal BIAS2. In the nMOS transistor 439, the drain is connected to the source of the nMOS transistor 437, the source is connected to the ground line, and the gate is connected to the bias input terminal BIAS1. In the nMOS transistor 440, the drain is connected to the source of the nMOS transistor 438, the source is connected to the ground line, and the gate is connected to the bias input terminal BIAS1.

As FIG. 4 shows, the substrates of the nMOS transistors 413 through 417, 426 through 427 and 435 through 440 are connected to the ground line, and the substrates of the pMOS transistors 411 and 412, 421 through 425 and 431 through 434 (n well regions) are connected to the high voltage power supply line VDD.

In the circuits in FIG. 2 to FIG. 4, the gate insulation film of each transistor is constructed such that the withstand voltage becomes low voltage VCC or more, and it is not necessary to be constructed such that the withstand voltage becomes high voltage VDD or more. Here VCC is determined to be VDD>VCC≧VDD−VCC. In other words, VCC is smaller than VDD, but more than VDD/2. In the circuits in FIG. 2 through FIG. 4, the withstand voltage between the diffusion region and the substrate of each transistor is set to be a value larger than the high voltage VDD. Also in the circuits in FIG. 2 through FIG. 4, the gate length of each transistor is set to be a gate length longer than the minimum gate length in the manufacturing process of the integrated circuits, including the differential input circuit 100.

Now the operation of the differential input circuit 100 shown in FIG. 1 through FIG. 4 will be described.

As mentioned above, the bias circuit 130 is comprised of five stages of current mirror circuits (see FIG. 3). Therefore a constant current flows into the transistors 302, 304, 306, 308 and 310. And by the voltage drop of these transistors 302, 304, 306, 308 and 310, the potentials BIAS1, BIAS2, BIAS3 and BIAS4 (0<BIAS1<BIAS2<BIAS3<BIAS4<VDD) are generated.

The clamp circuit 110 inputs the signal IN+ and potentials BIAS2 and BIAS3, as mentioned above (see FIG. 2A). Here if the input signal IN+ is lower than the potential difference BIAS3−Vthn (Vthn is a threshold voltage of the nMOS transistor), the nMOS transistor 201 is ON and the nMOS transistor 202 is OFF. Therefore the potential of the output signal INL+ is the same as the potential of the signal IN+. When the input signal IN+ rises and reaches BIAS3−Vthn, the nMOS transistor 201 turns OFF. Therefore when the input signal IN+ is between BIAS3−Vthn and BIAS3+Vthn, the potential of the output signal INL+ is fixed to BIAS3−Vthn. When the input signal IN+ reaches the BIAS3+Vthn, the nMOS transistor 202 turns ON. Because of this, the potential of the output signal INL+ becomes a potential the same as BIAS3. If the input signal IN+ is higher than the bias potential BIAS2−Vthp (Vthp is the threshold voltage of the pMOS transistor), the pMOS transistor 203 is ON and the pMOS transistor 204 is OFF. Therefore the potential of the output signal INH+ is the same as the potential of the signal IN+. When the input signal IN+ falls and reaches the BIAS2−Vthp (BIAS2, Vthp<0), the pMOS transistor 203 turns OFF. Therefore when the input signal IN+ is between BIAS2−Vthp and BIAS2+Vthp, the potential of the output signal INH+ is fixed to BIAS2−Vthp. When the input signal IN+ reaches BIAS2+Vthp, the pMOS transistor 204 turns ON. Because of this, the potential of the output signal INH+ becomes a potential the same as BIAS2. In this way, the output signals shown in FIG. 10A can be obtained.

The clamp circuit 120 inputs the signal IN− and the potentials BIAS2 and BIAS3, as mentioned above (see FIG. 2A). Here if the input signal IN− is lower than the bias potential BIAS3−Vthn (Vthn is a threshold voltage of the nMOS transistor), the nMOS transistor 211 is ON and the nMOS transistor 212 is OFF. Therefore the potential of the output signal INL− is the same as the potential of the signal IN−. When the input signal IN− rises and reaches BIAS3−Vthn, the nMOS transistor 211 turns OFF. Therefore when the input signal IN− is between BIAS3−Vthn and BIAS3+Vthn, the potential of the output signal INL− is fixed to BIAS3−Vthn. When the input signal IN− reaches BIAS3+Vthn, the nMOS transistor 212 turns ON. Because of this, the potential of the output signal INL− becomes a potential the same as BIAS3. If the input signal IN− is higher than the bias potential BIAS2−Vthp (Vthp is a threshold voltage of the pMOS transistor), the pMOS transistor 213 is ON and the pMOS transistor 214 is OFF. Therefore the potential of the output signal INH− is the same as the potential of the signal IN−. When the input signal IN− falls and reaches BIAS2−Vthp (BIAS2, Vthp<0), the nMOS transistor 213 turns OFF. Therefore when the input signal IN− is between BIAS2−Vthp and BIAS2+Vthp, the potential of the output signal INH− is fixed to BIAS2−Vthp. When the input signal IN− reaches BIAS2+Vthp, the nMOS transistor 214 turns ON. Because of this, the potential of the output signal INH− becomes a potential the same as BIAS2. In this way, the output signals shown in FIG. 10B can be obtained.

The folded cascode amplification circuit 140 (see FIG. 4) generates and outputs the differential output signals OUT+ and OUT− according to the values of the differential input signals IN+ and IN−. Operation in this case will now be described for each case of BIAS2≦IN+ and IN−≦BIAS3, the case of BIAS2<BIAS3≦IN+ and IN−, and IN−≦BIAS2≦BIAS3. In the following description, the case of IN+<IN− is used as an example. The folded cascode amplification circuit 140 is symmetric for the differential input signals IN+ and IN−, and therefore operation in the case of IN+>IN− is the same as operation in the case of IN+≦IN−. So description in the case of IN+>IN− is omitted.

First of all, the case of BIAS2≦IN+ and IN−≦BIAS3 will be described. In this case, if IN+≦IN−, the potentials of the signals INH+ and INL+ is the same as the potential of IN+, and the potential of the signals INH− and INL− is almost the same as the potential of IN− (see FIG. 10A and FIG. 10B). Therefore when the potential of the signal IN+ falls and the signal IN− rises, the potential of the signals INH+ and INL+ falls, and the potential of the signals INH− and INL− rises. These signals INH+, INL+, INH− and INL− are input to the folded cascode amplification circuit 140.

When the potential of the signal INL+ falls, the drain current of the nMOS transistor 415 decreases, so the drain current of the pMOS transistor 434 increases. When the potential of the signal INL− rises, the drain current of the nMOS transistor 416 increases, so the drain current of the pMOS transistor 433 decreases. Moreover when the potential of the signal INH+ falls, the drain current of the pMOS transistor 422 increases, so the drain current of the nMOS transistor 438 decreases. And when the potential of the signal INH− rises, the drain current of the pMOS transistor 423 decreases, so the drain current of the nMOS transistor 437 increases.

And the drain current of the pMOS transistor 433 decreases and the drain current of the nMOS transistor 437 increases, so the potential of the differential output signal OUT+ falls and becomes low level. The drain current of the pMOS transistor 434, on the other hand, increases, and the drain current of the nMOS transistor 438 decreases, so the potential of the differential output signal OUT− rises and becomes high level. The differential output signals OUT+ and out− are generated in this way. Here the output terminals of the differential output signals OUT+ and OUT− are clamped by the nMOS transistors 435 and 436. Therefore the potential of the differential output signals OUT+ and OUT− becomes a value between the ground level and the low voltage VCC.

When the signal IN+ further falls and the signal IN− further rises, the relationship IN+≦BIAS2<BIAS3≦IN− is established. In this case, as FIG. 10A and FIG. 10B show, the potential of the signal INL+ becomes almost the same as the potential of the signal IN+ (therefore INL+≦BIAS2), and the potential of the signal INH− becomes almost the same as the potential of the signal IN− (therefore BIAS3≦INH−). The potential of the signal INH+ is fixed to a potential almost the same as the bias potential BIAS2, and the potential of the signal INL− is fixed to a potential almost the same as the bias potential BIAS3. When the signal IN+ reaches the ground level and the signal IN− reaches the high voltage VDD, the potential of the signal INL+ reaches almost the ground level, and the potential of the signal INH− reaches almost the high voltage VDD.

The potential of the signal INL+ is lower than the bias potential BIAS1, so the nMOS transistor 415 turns OFF. Therefore the drain current of the pMOS transistor 434 rises to a value the same as the drain current of the pMOS transistor 432, and is fixed to this value. In the same way, the potential of the signal INH− is higher than the bias potential BIAS3, so the pMOS transistor 423 turns OFF. Therefore the drain current of the nMOS transistor 437 rises to a value the same as the drain current of the nMOS transistor 439, and is fixed to this value. The potential of the signal INL−, on the other hand, is fixed to the bias potential BIAS3, so the drain current of the nMOS transistor 416 is fixed, and therefore the drain current of the pMOS transistor 431 is fixed. In the same way, the potential of the signal INH+ is fixed to the bias potential BIAS2, so the drain current of the pMOS transistor 422 is fixed, and therefore the drain current of the nMOS transistor 440 is fixed. In this way, the differential output signal OUT+ is fixed to the minimum potential, and the differential output signal OUT− is fixed to the maximum potential.

Now the case of BIAS2<BIAS3≦IN+ and IN− will be described. As FIG. 10A and FIG. 10B show, the potential of the signals INL+ and INL− is fixed to BIAS3, the potential of the signal INH− becomes almost the same as the potential of the signal IN−, and the potential of the signal INH+ becomes almost the same as the potential of the signal IN+.

Since the potential of the signals INL+ and INL− is fixed, the drain current of the nMOS transistors 415 and 416 is also fixed, and therefore the drain current of the pMOS transistors 433 and 434 is also fixed. The drain current of the pMOS transistors 422 and 423, on the other hand, changes according to the potential of the signals INH+ and INH−, therefore the drain current of the nMOS transistors 437 and 438 changes according to the drain current of the pMOS transistors 422 and 423. Therefore the differential output signals OUT+ and OUT− change according to the potential of the signals INH+ and INH−.

Next, the case of IN+ and IN−≦BIAS2<BIAS3 will be described. As FIG. 10A and FIG. 10B show, the potential of the signals INH+ and INH− is fixed to BIAS2 in this case, the potential of the signal INL− becomes almost the same as the potential of the signal IN−, and the potential of the signal INL+ becomes almost the same as the potential of the signal IN+.

Since the potential of the signal INH+ and INH− is fixed, the drain current of the pMOS transistors 422 and 423 is also fixed, and therefore the drain current of the nMOS transistors 437 and 438 is also fixed. The drain current of the nMOS transistors 415 and 416, on the other hand, changes according to the potential of the signals INL+ and INL−, therefore the drain current of the pMOS transistors 433 and 434 changes according to the drain current of the nMOS transistors 415 and 416. Therefore the differential output signals OUT+ and OUT− change according to the potential of the signals INL+ and INL−.

In this way, according to the differential input circuit 100 of the present invention, the amplitude between the ground level (0 volts) and the high voltage VDD can be converted into the amplitude between the ground level and the low voltage VCC.

The differential input circuit 100 according to the present embodiment can be constructed with the transistors designed for low voltage VCC, although high voltage VDD is used for the power supply voltage. The reason for this will be described below.

The first clamp circuit 110 is comprised of the transistors 201–204 (see FIG. 2A), as mentioned above.

In the nMOS transistor 201, the gate potential is BIAS3. The source potential, which is the potential of the signal IN+, vibrates between the ground level and the high voltage VDD. The drain voltage, which is the signal INL+, vibrates between the ground level and the source potential BIAS3. Therefore the maximum voltage between the gate and the source is the higher one of BIAS3 and VDD−BIAS3. The maximum voltage between the gate and the drain is BIAS3. Furthermore the maximum voltage between the source and the drain is VDD−BIAS3. In this way, any voltage between terminals is sufficiently smaller than the high voltage VDD.

In the nMOS transistor 202, the gate potential, which is the signal IN+, vibrates between the ground level and the high voltage VDD. The source potential is BIAS3. The drain potential, which is the signal INL+, vibrates between the ground level and the source potential BIAS3. Therefore the maximum voltage between the gate and the source is the higher one of BIAS3 and VDD−BIAS3. Furthermore, the maximum voltage between the gate and the drain is VDD−BIAS3. The maximum voltage between the source and the drain is BIAS3. In this way, any voltage between terminals is sufficiently smaller than the high voltage VDD.

In the pMOS transistor 203, the gate potential is BIAS2. The source potential, which is the potential of the signal IN+, vibrates between the ground level and the high voltage VDD. The drain voltage, which is the signal INH+, vibrates between the bias potential BIAS2 and the high voltage VDD. Therefore the maximum voltage between the gate and the source is the higher one of BIAS2 and VDD−BIAS2. The maximum voltage between the gate and the drain is VDD−BIAS2. Furthermore, the maximum voltage between the source and the drain is BIAS2. In this way, any voltage between terminals is sufficiently lower than the high voltage VDD.

In the pMOS transistor 204, the gate potential, which is the signal IN+, vibrates between the ground level and the high voltage VDD. The source potential is BIAS2. The drain potential, which is the signal INH+, vibrates between the bias potential BIAS2 and the high voltage VDD. Therefore the maximum voltage between the gate and the source is the higher one of BIAS2 and VDD−BIAS2. The maximum voltage between the gate and the drain is BIAS2. The maximum voltage between the source and the drain is VDD−BIAS2. In this way, any voltage between terminals is sufficiently smaller than the high voltage VDD.

As a result, in the first clamp circuit 110, the withstand voltage of the gate oxide film and the withstand voltage between the source and the drain, which are required for each transistor 201 through 204, is very small, although high voltage VDD is used for the power supply voltage.

The withstand voltage of the gate oxide film and the withstand voltage between the source and the drain, which are required for each transistor 211 through 214 of the second clamp circuit 120 as well, are the same as each transistor of the clamp circuit 110.

The bias circuit 130 is constructed by connecting the five stages of the current mirror circuits in a series, as mentioned above. In other words, the pMOS transistors 301 and 303, and the nMOS transistors 305, 307 and 309 are connected in a series, and the pMOS transistor 302 and 304 and the nMOS transistors 306, 308 and 310 are connected in a series. Since the potential difference between the high voltage VDD and the ground level are divided into five transistors, the voltage between the source and the drain of each transistor is very small. The gate of the transistor pair of each current mirror circuit is connected to the drain of one transistor, so the voltage between the gate and the source and the voltage between the gate and the drain are also very small.

The first input circuit 410 of the folded cascode amplification circuit 140 has the transistors 411 through 417, as mentioned above.

When the nMOS transistor 415 is ON, current flows from the high voltage power supply VDD to the ground via the transistors 432, 411, 413, 415 and 417. Therefore the high voltage VDD is divided by these transistors. In the present embodiment, the transistors 411 and 413 of the first overvoltage protection circuit are provided, so the voltage between the source and the drain of each transistor is decreased. In the nMOS transistor 415, the gate voltage is BIAS3 at the maximum (see FIG. 10A), so the voltage between the gate and the source and the voltage between the gate and the drain are about VCC at the maximum. Here the gate potential of the pMOS transistor 411 is set to BIAS2, in order to decrease the ON resistance of the pMOS transistor 411.

When the nMOS transistor 415 is OFF, the gate potential of the nMOS transistor 415 is ground level at the minimum. The drain potential of the nMOS transistor 415 is clamped by the nMOS transistor 413, and does not exceed the low voltage VCC. In addition, the source potential of the nMOS transistor 415 is about ground level at the minimum. So the voltage between the gate and the source and the voltage between the gate and the drain of the nMOS transistor 415 do not exceed the low voltage VCC. The drain potential of the nMOS transistor 413 matches with the drain potential of the pMOS transistor 432, so does not become higher than VCC.

For the same reason, the voltage between the terminals of the transistors 412, 414 and 416 of the first input circuit 410 does not become higher than VCC. In addition, the voltage between the terminals of each transistor 421 through 427 of the second input circuit 420 does not become higher than VCC.

The amplification circuit 430 comprises the transistors 431, 433, 435, 437 and 439 which are connected in a series, and the transistors 432, 434, 436, 438 and 440 which are connected in a series. Current flows constantly through these transistors, so the high voltage VDD is divided by these transistors. Therefore the voltage between the source and the drain of each transistor is sufficiently small. In addition, the higher gate potential is applied for the transistor closer to the high voltage power supply VDD. Therefore the voltage between the gate and the source and the voltage between the gate and the drain of each transistor are also sufficiently small.

Now the voltage between the gate and the substrate of the transistor constituting each circuit 110 through 140 shown in FIG. 2 through FIG. 4 will be described.

The voltage between the gate and the substrates is higher than the low voltage VCC in each MOS transistor 201 through 204 in the first clamp circuit 110 (see FIG. 2A), MOS transistors 211 through 214 in the second clamp circuit 120 (see FIG. 2B), and each MOS transistor 411, 412, 415, 416, 422, 423, 426 and 427 in the folded cascode amplification circuit 140. However when the MOS transistor is ON, a channel with the same potential as the source region is created, so the applied voltage to the gate oxide film matches with the voltage between the gate and the source, and the potential of the substrate is not affected. When the MOS transistor is OFF, on the other hand, the sum Vgs+Vsb of the voltage between the gate and the source Vgs and the voltage between the source and the substrate Vsb is divided into the gate oxide film and the depletion layer, and is applied to the area between the gate and the substrate. However if the substrate potential rises, the depletion layer spreads, so voltage to be applied to the gate oxide film does not rise very much. Therefore reliability of the MOS transistor is not affected, even if the voltage between the gate and the substrate is higher than the withstand voltage of the gate oxide film.

As described above, in the differential input circuit 100 of the present embodiment, only a voltage equivalent to the low potential level VCC is applied to the gate oxide film of each transistor, although the power supply of the high potential level VDD is used. Therefore for the differential input circuit 100, a gate oxide film with a withstand voltage the same as an integrated circuit which uses a low voltage VCC power supply can be used.

The voltage between the source and the drain of each transistor is about low voltage VCC at the maximum. Therefore, according to the present embodiment, a differential input circuit with high reliability can be provided.

In addition, the input signals IN+ and IN− are input via the clamp circuits 110 and 120, so the input current can be decreased.

Also in the clamp circuit 110, the bias potential BIAS3 is supplied to the nMOS transistors 201 and 202, and the bias potential BIAS2 is supplied to the pMOS transistors 203 and 204 (that is, first reference potential<second reference potential), so the timings when the output signals INH+ and INL− are switched can be shifted. In the same way, in the clamp circuit 120, the bias potential BIAS3 is supplied to the nMOS transistors 211 and 212, and the bias potential BIAS2 is supplied to the pMOS transistors 213 and 214, so the timings when the output signals INH− and INL− are switched can be shifted. Therefore operation of the differential input circuit 100 can be established.

Second Embodiment

The differential input circuit according to the second embodiment of the present invention will now be described.

In the differential input circuit according to the present embodiment, the configuration of the folded cascode amplification circuit is different from that of the differential input circuit of the first embodiment.

Figure 5:
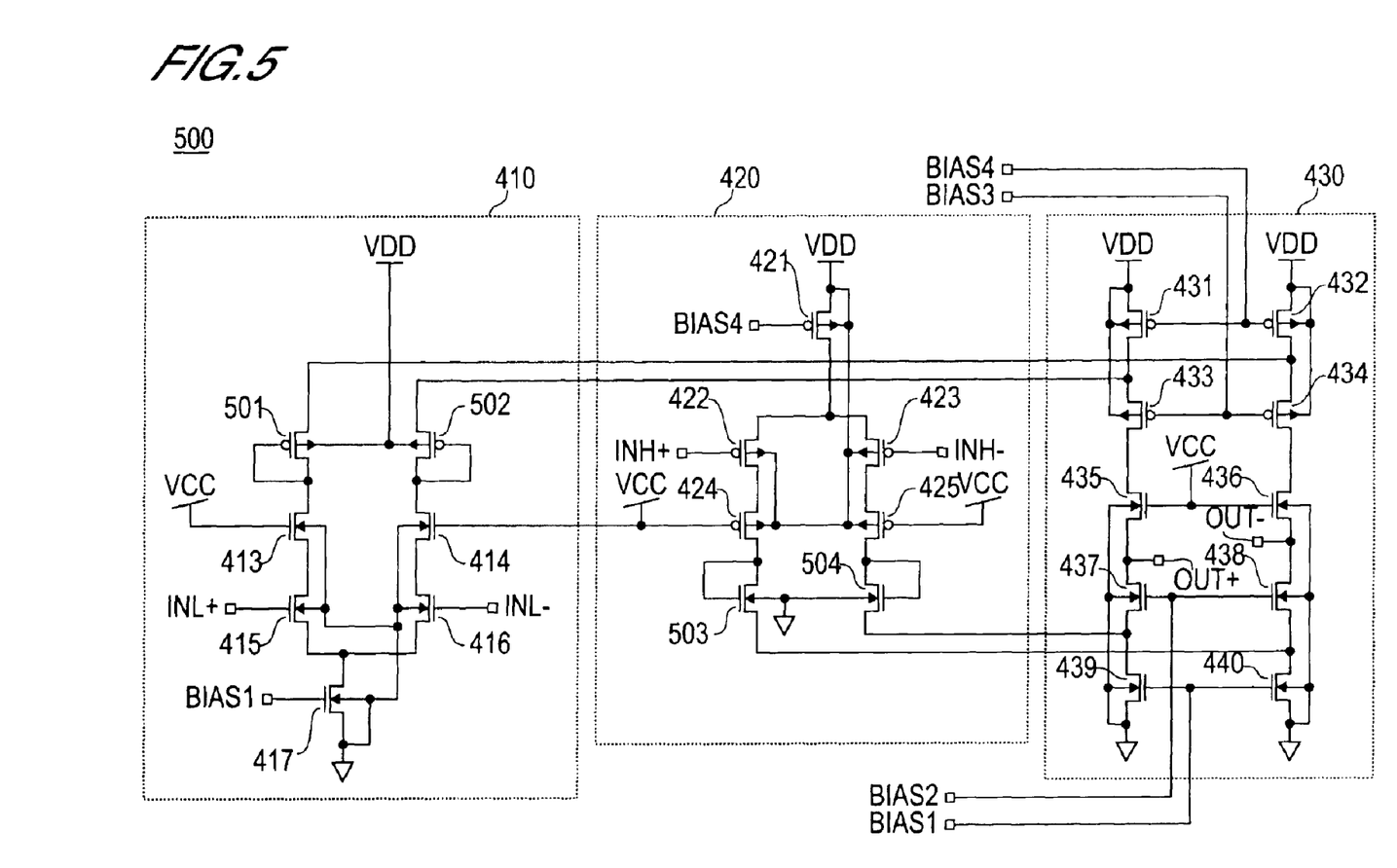
FIG. 5 is a diagram depicting the internal configuration of the folded cascode amplification circuit according to the second embodiment.

FIG. 5 is a circuit diagram depicting the configuration of the folded cascode amplification circuit according to the present embodiment.

As FIG. 5 shows, in this folded cascode amplification circuit 500, the pMOS transistors 501 and 502, where the gate and the drain are connected, are provided instead of the pMOS transistors 411 and 412 in FIG. 4. In addition, the nMOS transistors 503 and 504, where the gate and the drain are connected, are provided instead of the nMOS transistors 426 and 427 in FIG. 4.

For the other configurations and general circuit operations, which are the same as the first embodiment, descriptions are omitted.

As just described, in the case of constructing the overvoltage protection circuit using the diode-connected transistors 501 through 504 as well, the voltage between the terminals of each transistor can be sufficiently decreased just like the folded cascode amplification circuit 140 of the first embodiment.

In addition, the bias potentials BIAS2 and BIAS3 are not used for the input circuits 410 and 420, so the influence of noise, which is superimposed on the bias potentials BIAS2 and BIAS3, is hardly received, and therefore better differential amplification characteristics can be obtained.

Third Embodiment

The differential input circuit according to the third embodiment of the present invention will now be described.

In the differential input circuit according to the present embodiment, the configuration of the folded cascode amplification circuit is different from that of the differential input circuit of the first embodiment.

Figure 6:
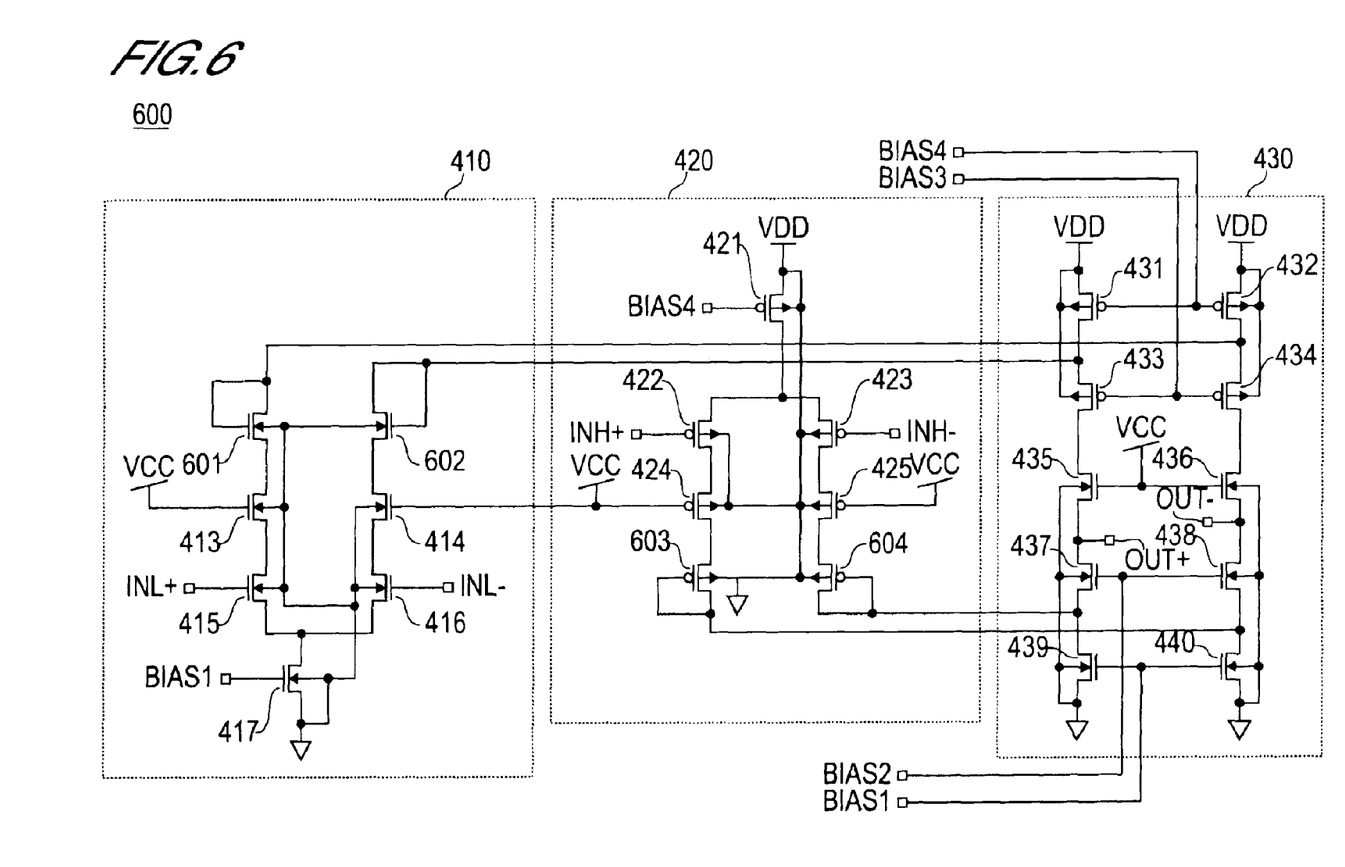
FIG. 6 is a diagram depicting the internal configuration of the folded cascode amplification circuit according to the third embodiment.

FIG. 6 is a circuit diagram depicting the configuration of the cascode amplification circuit according to the present embodiment.

As FIG. 6 shows, in this folded cascode amplification circuit 500, the nMOS transistors 601 and 602, where the gate and the drain are connected, are disposed instead of the pMOS transistors 411 and 412 in FIG. 4. In addition, the pMOS transistors 603 and 604, where the gate and the drain are connected, are disposed instead of the nMOS transistors 426 and 427 in FIG. 4.

For the other configurations and general circuit operations, which are the same as the first embodiment, descriptions are omitted.

As just described, in the case of constructing the overvoltage protection circuit using the diode-connected transistor 601 through 604 as well, the voltage between the terminals of each transistor can be sufficiently decreased just like the folded cascode amplification circuit 140 of the first embodiment.

In addition, the bias potentials BIAS2 and BIAS3 are not used for the input circuits 410 and 420, so the influence of noise, which is superimposed on the bias potentials BIAS2 and BIAS3, is hardly received, and therefore better differential amplification characteristics can be obtained.

Fourth Embodiment

The differential input circuit according to the fourth embodiment of the present invention will now be described.

In the differential input circuit according to the present embodiment, a full depletion type SOI (Silicon On Insulator) constitutes each circuit, which is different from the first embodiment.

Figure 7:
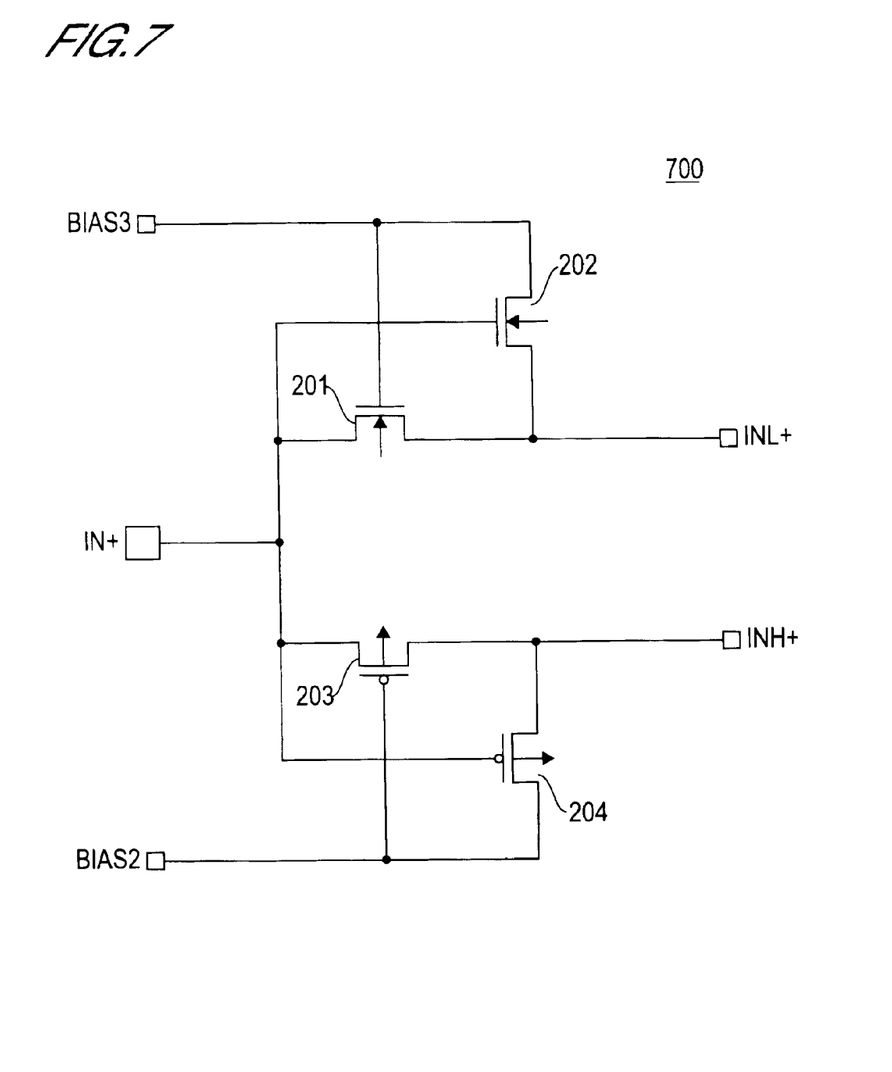
FIG. 7 is a diagram depicting the internal configuration of the first clamp circuit according to the fourth embodiment.

FIG. 7 is a circuit diagram depicting the configuration of the first clamp circuit 700 according to the present embodiment. Each transistor in FIG. 7 is denoted with the same reference numeral of each corresponding transistor in FIG. 2A. The configuration of the second clamp circuit, which is the same as the configuration of the first clamp circuit 700, is not illustrated.

Figure 8:
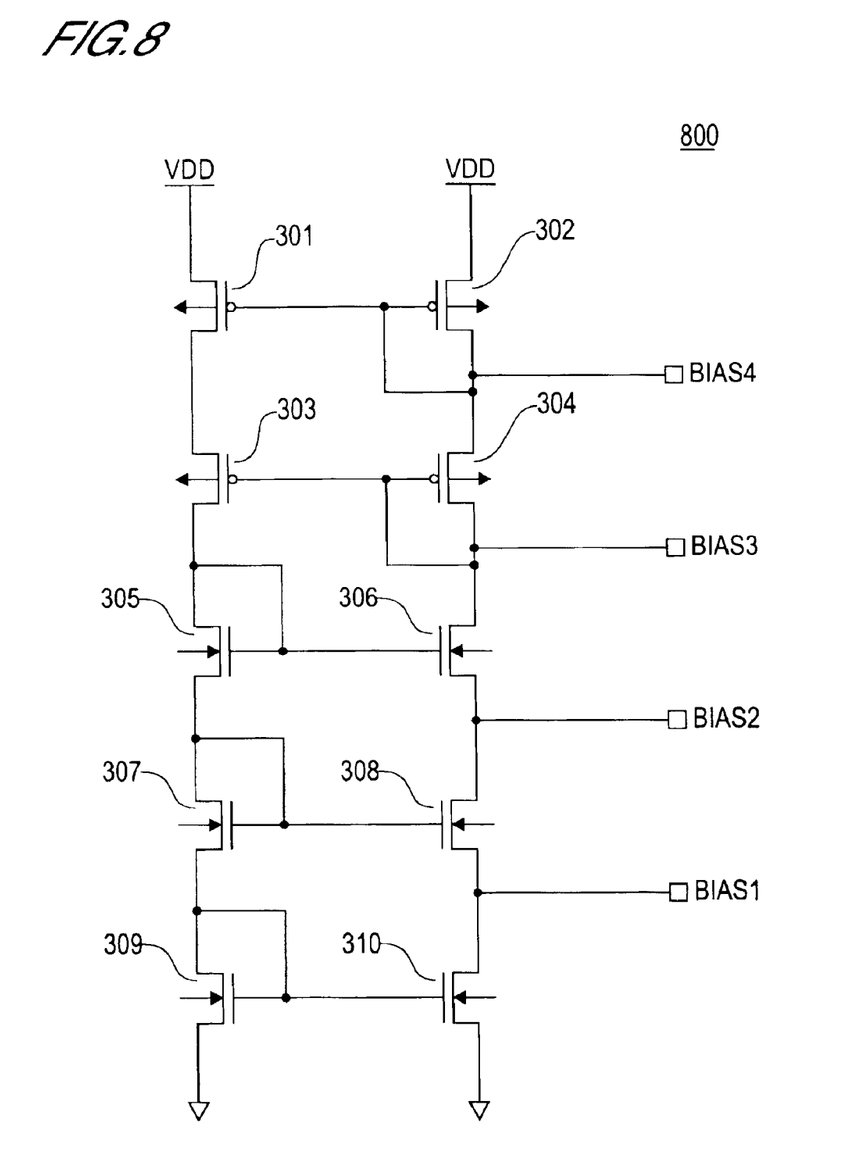
FIG. 8 is a diagram depicting the internal configuration of the bias circuit according to the fourth embodiment.

FIG. 8 is a circuit diagram depicting the configuration of the bias circuit 800 according to the present embodiment. Each transistor in FIG. 8 is denoted with the same reference numeral as each corresponding transistor in FIG. 3.

Figure 9:
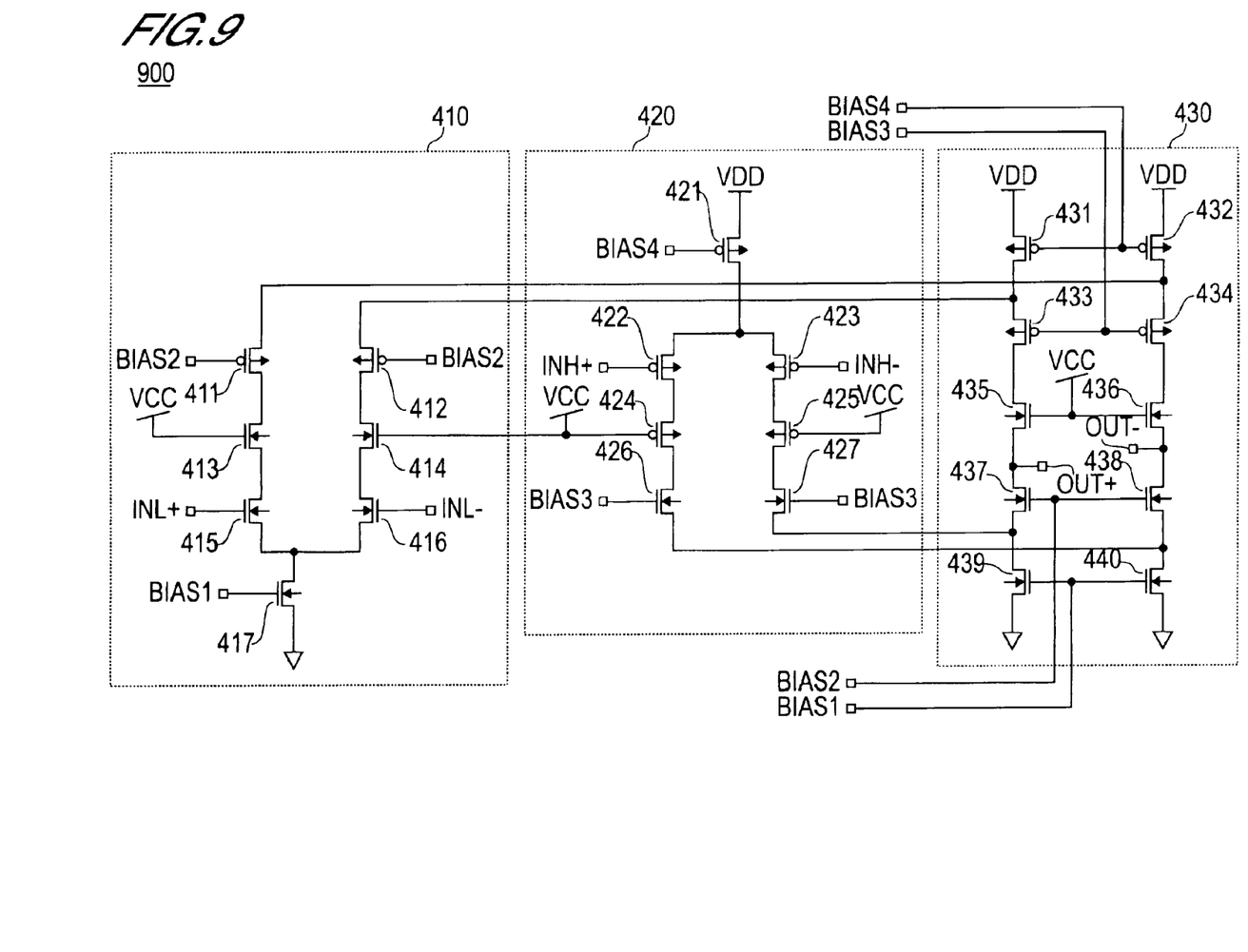
FIG. 9 is a diagram depicting the internal configuration of the folded cascode amplification circuit according to the fourth embodiment.

FIG. 9 is a circuit diagram depicting the configuration of the folded cascode amplification circuit 900 according to the present embodiment. Each transistor in FIG. 9 is denoted with the same reference numeral as each corresponding transistor in FIG. 4.

As FIG. 7 through FIG. 9 show, when a full depletion type SOI is used, the body region (i.e. the region corresponding to the substrate of the bulk CMOS structure) is set to the floating status.

As mentioned above, in the differential input circuit according to the first embodiment, the PM junction between each diffused region and substrate in an MOS transistor is constructed such that the reverse bias withstand voltage is higher than the high voltage VDD. Whereas in an SOI substrate, a buried oxide film with a 100 to 500 nm thickness is created under the surface silicon layer, and the pMOS transistor creation region and the nMOS transistor creation region are isolated from each other by an oxide film with a 100 to 500 nm thickness. The withstand voltage of this isolating oxide film (corresponds to the reverse bias withstand voltage between the diffused region and the substrate in the bulk CMOS structure) is 10V or more. Therefore according to the present embodiment, the differential input circuit can be designed without considering the withstand voltage between the diffused region and the substrate at all.

In addition, by completely isolating the element region by the oxide film, the parasitic capacitance of the source region and the drain region is decreased, and therefore high-speed operation is expected. Also by the isolation of elements in the SOI structure, substance noise and the junction leak current can be decreased.

As described above, according to the present invention, a differential input circuit, which is comprised only of low withstand voltage transistors and operates with high power supply voltage, can be provided.

What is claimed is:

1. A differential input circuit, comprising:

a signal input terminal pair for inputting a differential input signal pair which vibrates between a first power supply potential supplied by a first power supply line and a second power supply potential supplied by a second power supply line, wherein the first power supply potential is smaller than the second power supply potential);

a first clamp circuit for generating a first control signal which depends on a higher one of one of said differential input signal pair and a first reference potential, and for generating a second control signal which depends on a lower one of said one of differential input signal pair and a second reference potential;

a second clamp circuit for generating a third control signal which depends on a higher one of the other of said differential input signal pair and said first reference potential, and for generating a fourth control signal which depends on a lower one of the other of said differential input signal pair and said second reference potential;

a first input circuit comprising a first input transistor which inputs said second control signal from a control terminal, where a first main electrode is connected to said first power supply line via a first constant current source, and a second input transistor which inputs said fourth control signal from the control terminal, where the first main electrode is connected to said first power supply line via said first constant current source;

a second input circuit comprising a third input transistor which inputs said first control signal from the control terminal, where the first main electrode is connected to said second power supply line via a second constant current source, and a fourth input transistor which inputs said third control signal from the control terminal, where the first main electrode is connected to said second power supply line via said second constant current source;

an amplification circuit comprising a first output transistor which inputs a third power supply potential (wherein first power supply potential<third power supply potential<the second power supply potential) supplied by a third power supply line and outputs one of the differential output signals from the first main electrode; a second output transistor which inputs said third power supply potential from the control terminal and outputs the other of the differential output signals from the first main electrode; a third constant current source which supplies current received from said second power supply line to the second main electrodes of said first output transistor and said second input transistor; a fourth constant current source which supplies current received from said second power supply line to the second main electrodes of said second output transistor and said first input transistor; a fifth constant current source which emits the current received from the second main electrodes of said fourth input transistor and said first output transistor to said first power supply line; and a sixth constant current source which emits the current received from the second main electrodes of said third input transistor and said second output transistor to said first power supply line; and a bias circuit for supplying control potential, which makes the voltage between the control electrode and the first main electrode and the voltage between the control electrode and the second main electrode smaller than the potential difference between said first and third power supply potentials, to the transistors constituting said first to sixth constant current sources.

2. The differential input circuit according to claim 1, wherein one or a plurality of protective transistors are provided between said first input transistor and said fourth constant current source for making the voltage between the first and second main electrodes of said first input transistor smaller than the potential difference between said first and third power supplies.

3. The differential input circuit according to claim 2, wherein said bias circuit supplies a control potential, which makes the voltage between the control electrode and the first main electrode and the voltage between the control electrode and the second main electrode smaller than the potential difference between said first and third power supplies, to a part or all of said protective transistors.

4. The differential input circuit according to claim 1, wherein one or a plurality of protective transistors are provided between said second input transistor and said third constant current source for making the voltage between the first and second main electrodes of said second input transistor smaller than the potential difference between said first and third power supplies.

5. The differential input circuit according to claim 4, wherein said bias circuit supplies a control potential, which makes the voltage between the control electrode and the first main electrode and the voltage between the control electrode and the second main electrode smaller than the potential difference between said first and third power supplies, to part or all of said protective transistors.

6. The differential input circuit according to claim 1, wherein one or a plurality of protective transistors are provided between said third input transistor and said sixth constant current source for making the voltage between the first and second main electrodes of said third input transistor smaller than the potential difference between said first and third power supply potentials.

7. The differential input circuit according to claim 6, wherein said bias circuit supplies a control potential, which makes the voltage between the control electrode and the first main electrode and the voltage between the control electrode and the second main electrode smaller than the potential difference between said first and third power supplies, to part or all of said protective transistors.

8. The differential input circuit according to claim 1, wherein one or a plurality of protective transistors are provided between said fourth input transistor and said fifth constant current source for making the voltage between the first and second main electrodes of said fourth input transistor smaller than the potential difference between said first and third power supply potentials.

9. The differential input circuit according to claim 8, wherein said bias circuit supplies a control potential, which makes the voltage between the control electrode and the first main electrode and the voltage between the control electrode and the second main electrode smaller than the potential difference between said first and third power supplies, to part or all of said protective transistors.

10. The differential input circuit according to claim 1, wherein one or a plurality of protective transistors are provided between said third constant current source and said first output transistor for making the voltage between the first main electrode and the second main electrode of said first output transistor smaller than the potential difference between said first and third power supply potentials.

11. The differential input circuit according to claim 1, wherein one or a plurality of protective transistors are provided between said fifth constant current source and said first output transistor for making the voltage between the first main electrode and the second main electrode of said first output transistor smaller than the potential difference between said first and third power supply potentials.

12. The differential input circuit according to claim 1, wherein one or a plurality of protective transistors are provided between said fourth constant current source and said second output transistor for making the voltage between the first main electrode and the second main electrode of said second output transistor smaller than the potential difference between said first and third power supply potentials.

13. The differential input circuit according to claim 1, wherein one or a plurality of protective transistors are provided between said sixth constant current source and said second output transistor for making the voltage between the first and the second main electrodes of said second output transistor smaller than the potential difference between said first and third power supply potentials.

14. The differential input circuit according to claim 1, wherein said second reference potential is higher than said first reference potential.

15. The differential input circuit according to claim 1, wherein said first clamp circuit comprises:
- a first transistor of a first conductive type, which inputs one of said differential input signal pair from the first main electrode, and inputs said second reference potential from the control electrode, where said second main electrode is connected to the output node of said second control signal;
- a second transistor of the first conductive type, which inputs said second reference potential from the first main electrodes, and inputs one of said differential input signals from said control electrode, where the second main electrode is connected to the output node of said second control signal;
- a third transistor of the second conductive type, which inputs one of said differential input signal pair from the second main electrode, and inputs said first reference potential from the control electrode, where the first main electrode is connected to the output node of said first control signal; and
- a fourth transistor of the second conductive type, which inputs said first reference potential from the second main electrode, and inputs one of said differential input signals from said control electrode, where the second main electrode is connected to the output node of said first control signal.

16. The differential input circuit according to claim 1, wherein said second clamp circuit further comprises:
- a first transistor of a first conductive type, which inputs the other one of said differential input signal pair from the first main electrode, and inputs said second reference potential from the control electrode, where the second main electrode is connected to the output node of said fourth control signal;
- a second transistor of the first conductive type, which inputs said second reference potential from the first main electrode, and inputs the other one of said differential input signal from said control electrode, where the second main electrode is connected to the output of said fourth control signal;
- a third transistor of the second conductive type, which inputs the other one of said differential input signal pair from the second main electrode, and inputs said first reference potential from the control electrode, where the first main electrode is connected to the output node of said third control signal; and
- a fourth transistor of the second conductive type, which inputs said first reference potential from the second main electrode, and inputs the other one of said differential input signals from said control electrode, where the second main electrode is connected to the output node of said third control signal.

17. The differential input circuit according to claim 1, wherein said bias circuit further comprises a plurality of stages of current mirror circuits which are connected between said first power supply line and said second power supply line, and the control terminal of transistors constituting said first to sixth constant current sources inputs the potential of the connection node between the current output terminal of each current mirror circuit and the current input terminal of the current mirror circuit in the next stage.

18. The differential input circuit according to claim 1, wherein said first clamp circuit, said second clamp circuit, said folded cascode amplification circuit and said bias circuit are created on a full depletion type SOI substrate.

19. The differential input circuit according to claim 1, wherein said first and second clamp circuits, said first and second input circuits, said amplification circuit and said bias circuit are constructed only with transistors which have a gate oxide film with a film thickness having resistance against the potential difference between said first power supply potential and said third power supply potential.

* * * * *